United States Patent

[11] 3,582,838

[72] Inventor Adrian J. DeVries
Elmhurst, Ill.
[21] Appl. No. 721,038
[22] Filed Apr. 12, 1968
[45] Patented June 1, 1971
[73] Assignee Zenith Radio Corporation
Chicago, Ill.
Continuation-in-part of application Ser. No. 582,387, Sept. 27, 1966, now abandoned.

[54] SURFACE WAVE DEVICES
22 Claims, 15 Drawing Figs.

[52] U.S. Cl. .......... 333/72, 333/30, 310/9.5, 310/9.8
[51] Int. Cl. .......... H03h 7/10
[50] Field of Search .......... 333/30, 72, 6; 310/8.2, 9.5, 9.8; 250/211; 329/117; 332/26

[56] References Cited
UNITED STATES PATENTS

| | | | |
|---|---|---|---|
| 3,300,739 | 1/1967 | Mortley | 333/30 |
| 3,360,749 | 12/1967 | Sittig | 333/30 |
| 3,289,114 | 10/1966 | Rowen | 333/30 |
| 3,446,975 | 5/1969 | Adler et al. | 250/211 |
| 3,253,166 | 5/1966 | Osial et al. | 310/8.2 |
| 3,158,913 | 11/1964 | Prenosil | 329/117 |
| 3,108,230 | 10/1963 | Hurtig | 329/117 |
| 3,310,761 | 3/1967 | Brauer | 333/30 |
| 3,401,360 | 10/1968 | Schulz-Du Bois | 333/30 |
| 3,376,572 | 4/1968 | Mayo | 343/17.2 |

*Primary Examiner*—Herman Karl Saalbach
*Assistant Examiner*—C. Baraff
*Attorney*—Francis W. Crotty

ABSTRACT: A turnable wave signal receiver uses an acoustic filter system for interstage coupling and for obtaining a particular frequency response. For a television receiver, the acoustic system is included in the IF channel and imposes a desired IF characteristic with traps or null points at selected frequencies spaced from the IF carrier frequency and determined by the structure of interaction surface wave devices included in the acoustic filter system. For use in an FM receiver, the acoustic filter system serves as the discriminator to perform the necessary function of converting frequency to amplitude changes.

Additionally, particular forms of surface wave interaction devices for the acoustic filter system are disclosed as well as structural arrangements for tuning the system of controlling reflections of acoustic surface waves.

Inventor
Adrian J. DeVries
By Francis W. Crotty
Attorney

Inventor
Adrian J. DeVries
By Francis W. Crotty
Attorney

Inventor
Adrian J. DeVries
By Francis W. Crotty
Attorney

Inventor
Adrian J. DeVries
By Francis W. Crotty
Attorney

SURFACE WAVE DEVICES

CROSS-REFERENCE TO RELATED APPLICATION

The present application is a continuation-in-part of application Ser. No. 582,387, filed Sept. 27, 1966 but now abandoned.

BACKGROUND OF THE INVENTION

This invention pertains to solid-state tuned circuitry. More specifically, it relates to an acousto-electric filter system in which particular types of surface wave transducers coupled to a body of piezoelectric material propagative of acoustic surface waves are utilized in a manner enabling signal selectivity, and in which the transducer configuration or arrangement allows the loss normally associated with such a transducer to be minimized. While the apparatus is theoretically operable at any desired response frequency, practical considerations indicate that extensive use may be made of the device in integrated circuitry applications such as, for example, in IF strips for television receivers. The apparatus is, therefore, initially described in that environment. It is also of value for FM reception and may be employed in the IF channel, in the discriminator and the like, and modifications utilizing the invention in that area are considered.

Previous methods used to generate and detect surface elastic waves piezoelectrically involved the mechanical coupling of a compressional or shear wave transducer to the body on which the surface waves were to propagate. It is now known that a transducer composed of an electrode array, having interleaved combs of conducting stripes or "teeth" at alternating electric potentials, when coupled to a piezoelectric medium, produces acoustic surface waves on the medium which, in the simplified case of a ceramic poled perpendicularly to the surface, travel at right angles to the stripes. This wave is converted back to an electrical signal by a similar array of conducting stripes coupled to the piezoelectric medium near its output end. In principle, the stripe pattern may be thought of as an antenna array. Consequently, similar selectivity should be possible, thereby eliminating the need for the critical or much larger and more cumbersome components normally associated with selective circuitry.

Accordingly, it is a primary object of the present invention to utilize a comb-type electrode array to provide a frequency selective circuit sufficiently small for use in integrated circuitry applications.

Due to the fact that the wave as transmitted in one direction from the input transducer to the output transducer may be only one of two waves produced by the input transducer, the other traveling in the exactly opposite direction, there is usually a 3 db. loss associated with the input transducer. A similar loss occurs at the output transducer. Therefore, it is a further object of the present invention to provide an acoustic filter system in which the transducer configuration or arrangement is such as to reduce the inherent loss associated with such electroacoustic systems.

It is yet another object of the present invention to provide modifications which permit varying the center or maximum response frequency of the acoustic filter.

SUMMARY OF THE INVENTION

Still another object of the invention is to provide an acoustic filter system as a component of a wave signal receiver and which determines the frequency response characteristic of the receiver in accordance with structural features of the filter system.

In accordance with the invention, an acoustic filter system couples the tunable input stage of a wave signal receiver, such as a television receiver, to a load, such as the video processing stages, in order to deliver thereto a selected program signal for utilization. The filter system comprises a body of piezoelectric material propagative of acoustic surface waves. A first electrode array, comprised of interleaved combs of conductive elements actively coupled to a first surface portion of that body and having input terminals coupled to the input stage of the receiver, responds to the selected program signal to launch acoustic surface waves along the body. The electrode array is predominantly responsive at a frequency which bears a predetermined relation to the program signal; for example, the predominant frequency may correspond with the intermediate frequency of the receiver. The center-to-center spacing between the conductive elements of the combs is effectively one-half the wavelength of acoustic surface waves at the aforesaid predominant frequency. Interaction means, comprised of a second similar electrode array coupled to a second surface portion of the body and having output terminals connected to the load, respond to the launched acoustic surface waves to deliver to the load signal energy translated by the acoustic waves.

In accordance with one feature of the invention a desired frequency response is imposed on the receiver by the specific structure of the surface wave interaction devices through which acoustic waves are launched in a piezoelectric body and also through which energy is abstracted from the acoustic waves.

Other features of the invention concern structural arrangements of the acoustic filter system and its components, especially the arrangement of its interaction devices, to take advantage of reflections which in the environment of a television receiver might otherwise result in undesirable ghosts.

DESCRIPTION OF THE DRAWINGS

The features of the present invention which are believed to be novel are set forth with particularity in the appended claims. The organization and manner of operation of the invention, together with further objects and advantages thereof, may best be understood by reference to the following description taken in conjunction with the accompanying drawings, in the several figures of which like reference numerals identify like elements and in which:

In FIG. 1, a signal source 10 in series with a resistor 11, which may represent the internal impedance of that source, is connected in parallel with an inductor 12 across an input transducer or surface wave interaction device 13 mechanically coupled to one major surface of a body of piezoelectric material shown as a substrate 14. An output or second portion of the same surface of substrate 14 is, in turn, mechanically coupled to an output transducer 15 which is coupled across a load 18 in parallel with an inductor 16. The resistor 17 may or may not be included as the requirements of the installation dictate.

Figure 1:
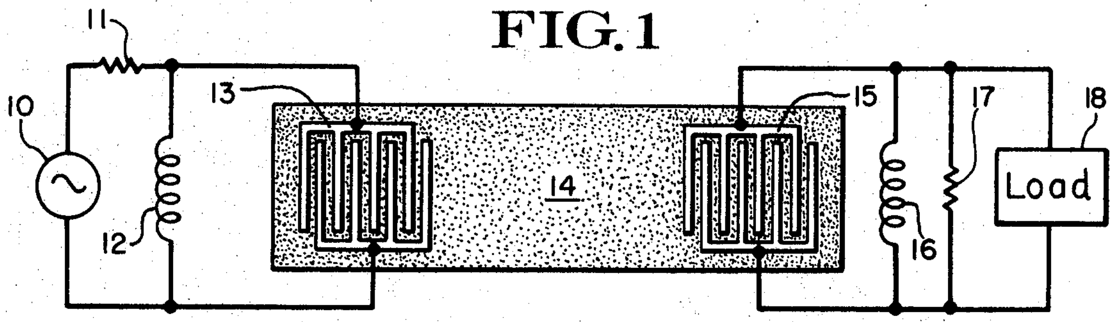
FIG. 1 is a partly schematic plan view of one embodiment of an acoustic filter system.

Transducers 13 and 15 in the simplest arrangement are identical and are constructed of two comb-type electrode arrays. The stripes or conductive elements of one comb are interleaved with the stripes of the other. The electrodes are of a material such as gold which may be vacuum deposited on the plane surface of a highly lapped and polished piezoelectric substrate 14 of a material that is propagative of acoustic surface waves, such as PZT or quartz. The distance between the centers of two consecutive stripes in each array is one-half of the acoustic wavelength of the signal wave for which it is desired to achieve maximum response.

For the purpose of facilitating an understanding of this device and, in particular, of its differences from previous devices, operation in a typical and simple embodiment will be explained initially. Specifically, direct piezoelectric surface wave transduction is accomplished by the spatially periodic interdigital electrodes of transducer 13. Considering this device as a transmitter, a periodic electric field is produced when a signal from source 10 is fed to the electrodes and through piezoelectric coupling the electrical signal is transduced to a traveling acoustic surface wave on substrate 14. This occurs when the strain components produced by the electric fields in the piezoelectric substrate are substantially matched to the strain components associated with the surface wave mode. Source 10, for example a television receiver, produces a range of signal frequencies, but due to the selective nature of the arrangement only a particular frequency and its intelligence-carrying sidebands are converted to a surface wave. More specifically, source 10 may be the tunable front end of a television receiver which selects a desired program signal for application to load 18 which, in this environment, comprises these stages of a television receiver subsequent to the IF selector which respond to the program signal in producing a television image and its associated audio program. The surface wave resulting in substrate 14 in response to the energization of transducer 13 by the IF output signal from source 10 is translated along the substrate to output transducer 15 where it is converted to an electrical output signal for application to load 18.

In a typical television IF embodiment, utilizing quartz as the piezoelectric substrate 14, the stripes of both transducer 13 and transducer 15 are approximately 0.7 mils wide and are separated by 0.7 mils for the usual IF application, that is to say, for the application of an IF signal in the range of 40—46 MHz. The spacing between transducer 13 and transducer 15 is on the order of 0.3 inch and the width of the wave front is approximately 0.4 inch. This structure of transducers 13, 15 and substrate 14 acts as a double-tuned circuit with a resonant frequency of approximately 40 megahertz, the resonant frequency being determined by the spacing of the stripes as described more particularly hereafter.

The potential developed between any given pair of successive stripes in the electrode array 13 produces two waves traveling along the surface of substrate 14, in opposing directions perpendicular to the stripes for the illustrative isotropic case. When the distance between the stripes is one-half of the acoustic wavelength of the wave at the desired input frequency, or an integral multiple thereof, relative maxima of the output wave are produced by piezoelectric transduction in interaction device 15. For increased selectivity, additional electrode stripes are added to the comb patterns of devices 13 and 15 as described in greater detail hereinafter.

Inductor coils 12 and 16 are for matching purposes and are added to tune with the clamped capacitance $C_o$, that is, the capacity associated with or exhibited by the electrode stripe arrays 13 and 15 when they are clamped for surface waves thereby making the input impedance real. In a manner to be described, inductance variations of coils 12 and 16 provide a convenient parameter for shaping the response of interaction devices 13 and 15 and, therefore, for determining a desired IF frequency characteristic for the receiver. It is useful to observe that the same coils could also be used to couple the desired signal to or from one or more different substrates carrying amplifiers, elements or functional devices. By varying the position and spacing of the coils on the separate substrates, the coupling coefficient is changed. In addition, the combs of the interaction devices may be so constructed as to eliminate the "dead" or clamped capacitance, obviating the need of coils 12, 16. Such a device is described in the copending application of Adrian DeVries and Fleming Dias, Ser. No. 710,118, filed Mar. 4, 1968, and assigned to the same assignee. The Q's of the loaded coupled circuits formed by the coils, however, should preferably be smaller than the effective Q of the acoustic filter circuit so that variations of clamped capacity do not affect the response more than can be tolerated.

Figure 1A:
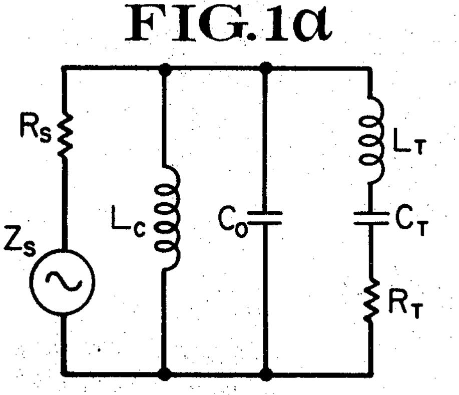
FIG. 1*a* is an electrical representation of one terminal portion of such a system including a signal source.

More particularly, the equivalent circuit of interaction devices 13, 15 is shown in FIG. 1*a*, assuming that $Z_s$, $R_s$ is an impedance that may be either the signal source coupled to device 13 or the load coupled to device 15; inductor $L_c$ is coil 12 or 16 for resonating with clamped capacitance $C_o$; and $L_T$, $C_T$, $R_T$ represent in terms of inductance, capacitance and AC impedance the electrical equivalent of the mechanical parameters of interaction device 13 or 15 as a surface wave transducer. Preferably, the Q of the circuit containing $R_s$ in conjunction with $L_c$, $C_o$ is small relative to the Q of circuit $L_T$, $C_T$, $R_T$ which is the electrical analogue of the combination represented by the interaction device 13 or 15 in coupled relation with substrate 14. It is apparent that an impedance transformation will be achieved simultaneously with the tuning out of clamped capacitance $C_o$ if resonating inductance $L_c$ is connected in series with $R_s$ and the input terminals of the transducer.

Figure 2:
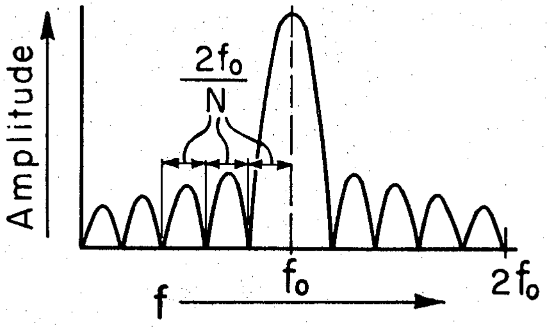
FIG. 2 is a plot of the amplitude of the received signal as a function of frequency, showing the selectivity of a single surface wave interaction device of the type used in the system of FIG. 1.

FIG. 2 depicts a selectivity curve with relative maximum and associated side lobes as expected for a transducer of the type utilized in the FIG. 1 apparatus, neglecting the effect of tuning inductance 12. A simplified analysis indicates that the selectivity of such a transducer with N+1 stripes may be compared with a coil having a Q of the order of N. The resonance curve is broader than the peak of a single-tuned circuit and the phase response is flat over a large range. Some of the spurious responses can be reduced by selecting the number of stripes in the transmitting transducer to be different from the number of stripes in the receiving transducer. Other desired variations in the selectivity characteristics may be obtained if the length of a given stripe is altered with respect to other stripes.

The selectivity curve of FIG. 2 is of the sin *x*/*x* variety and is symmetrical with respect to the frequency $f_o$ at which the interaction device has its maximum interaction with substrate 14. It has null points or minimum responses at frequencies which have a frequency separation of $2 f_o/N$ where N is the number of elemental transducers included in each electrode array 13 and 15. That is to say, each conductive element of either of the interleaved combs in these arrays forms an elemental transducer with each contiguous neighbor and, therefore, the number N of elemental transducers is one less than the number of conductive elements of either array. The selectivity pattern or frequency response of each interaction device is proportional to the following:

$$\frac{\sin N\frac{\Delta f}{f_0}\frac{\pi}{2}}{N\frac{\Delta f}{f_0}\frac{\pi}{2}} \qquad (1)$$

where $\Delta f$ is the deviation from the frequency of maximum response. It has a dominant response region plus symmetrical side lobes the attenuation of which is approximately proportional to the following:

$$20 \log \frac{(2P+1)}{2}\pi \qquad (2)$$

in decibels $P$ is an integer designating the order of the side lobe, first, second, etc. Equation (1) makes clear that the selectivity is subject to adjustment and, therefore, an acoustic filter system patterned after FIG. 1 is very attractive for use as the IF channel of a color television or monochrome receiver. An illustrative example of such an IF will be specified more particularly hereafter. The response defined in Expression (1) is obtained if the conductive elements of the interleaved combs are of uniform dimensions. The response may be modified by using nonuniform dimensions. For example, the lengths of the conductive elements may decrease along the length of the combs converting the characteristic to an exponential or other function.

When inductor 12 is present, the shape of the principal lobe of the response characteristic, as well as the side lobes, is charged in a manner that depends upon the frequency at which this inductor tunes out the clamped capacitance of the transducer. Of course, the response is also influenced by the relative values of the parameters represented in FIG. 1*a*.

The discussion to this point has been confined to the response of a single transducer. The system response can be approximated by the summation of the individual responses of its pair of transducers. The characteristics of the substrate may have a second order effect on the system response.

In mounting the substrate with its interaction devices in place, it is necessary that the substrate be flat, that is, it should not be bent or the surface wave phenomenon may be disturbed. If the thickness of the substrate is large relative to the wavelength of the surface wave, there will be very little influence of the supporting structure on the performance of the acoustic filter system.

Figures 3, 4, 5:
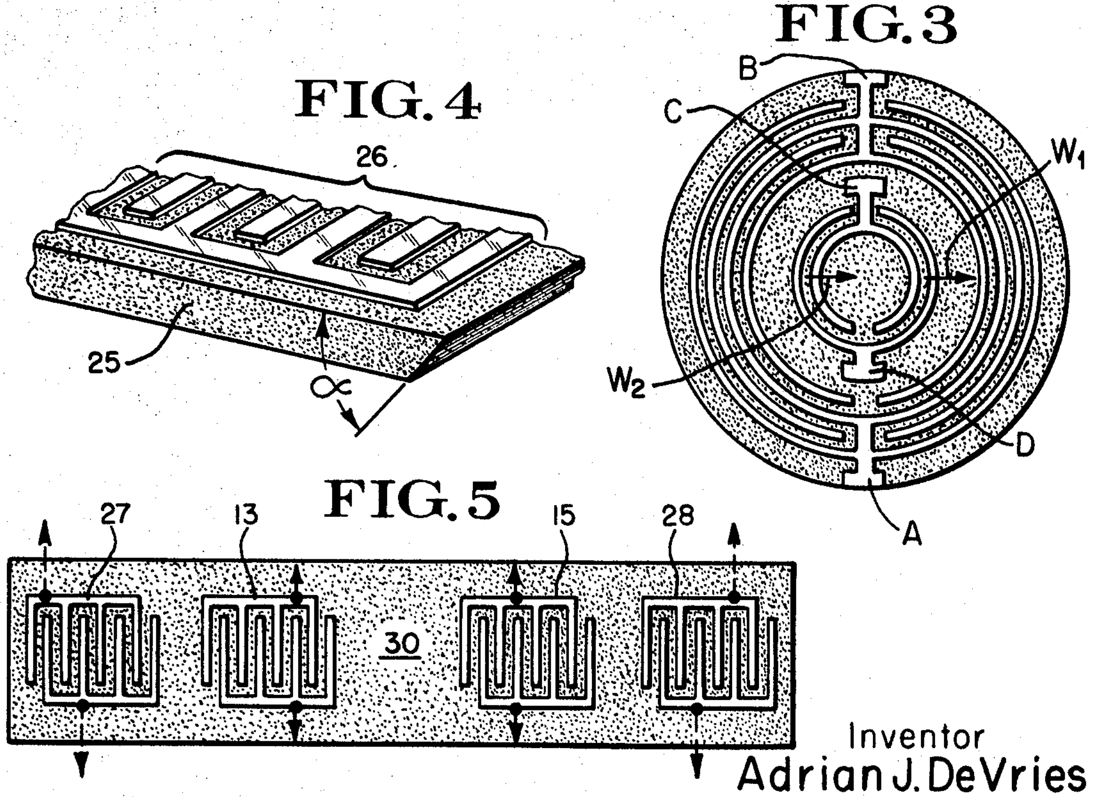
FIG. 3 is a plan view of another form of interaction device or transducer.
FIG. 4 is a fragmentary perspective view of an acoustic filter system in which a transverse end portion of the piezoelectric body is slanted at angle $\alpha$ with respect to its acoustic wave propagating surface.
FIG. 5 is a plan view of a piezoelectric substrate upon which are mounted two pairs of the type of transducer used in the device of FIG. 1.

The apparatus described in FIG. 1 has a theoretical minimum loss of 6 db. due to the symmetry of the surface waves about the interaction devices or transducers 13 and 15. FIG. 3 depicts a curved-stripe interdigital-electrode transducer configuration which eliminates 3 db. of that loss. In this case each conductive element of the interleaved electrode arrays is a major segment of, and nearly a complete circle. Circle sectors of varying degrees of arc may, of course, be used. The outer pattern has terminals A, B while the inner pattern has terminals C, D, the two patterns constituting input and output transducers. When the round stripes of the inner pattern are located so that the diameter of the middle of the stripe is $n\lambda$ where $n$ is an integer and $\lambda$ is the acoustic surface wavelength at the frequency of maximum response, the wave moving inward within the center of the transducer reinforces the wave moving outward. Furthermore, the four poles formed by the pairs AB and CD in FIG. 3 act as a tuned transformer. The transformer ratio is of the order of the ratio of the square root of the average diameter of the pattern if the transmitter and receiver patterns have the same effective number of lines or conductive elements.

It follows, then, that to adjust the input and output impedance of this transducer configuration, two factors must be considered. Firstly, a given wave passes through a stripe of the inside transducer twice while it passes through a stripe of the outside transducer only once so that there are effectively twice as many inside stripes as outside stripes. And secondly, the transformer ratio affects the impedance. A more complete understanding of the interaction device of FIG. 3 will be derived from assuming that the inner device C, D is the transmitter, that is, the device to which an electrical signal is applied. Since the conductive elements are essentially circular and since acoustic surface wave propagation is normal to the conductive elements, the acoustic waves travel in radial directions. Two such waves $W_1$ and $W_2$ are indicated in FIG. 3, originating at the right- and left-hand sides respectively of the transmitting interaction device. In view of the dimensions of the circular conductive elements, recited above, these waves reinforce one another at the right-hand side of the receiving device C,D. At the same time, counterparts of waves W1 and W2 propagate in the opposite direction and supplement each other in the left-hand side of device c,D. In this way, the efficiency of the device is increased.

As a modification of the FIG. 1 device, in FIG. 4 an output comb transducer 26 is mechanically coupled to a major surface of a piezoelectric substrate 25 and an end surface of substrate 25 that is transverse to the direction of wave propagation makes an acute angle $\alpha$ with the propagating surface. The angle $\alpha$ may be either acute or obtuse.

Reflection of the surface wave at the edge of the substrate may be utilized to reduce the transducer loss. By properly locating or spacing the edge with respect to the input and output transducers so as to provide constructive interference by the reflected wave, that is, by having the reflected wave of proper phase to augment the direct wave, the 3 db. loss associated with each transducer may be reduced. It has been observed, however, that surface waves do not totally reflect from a physical edge of a solid substrate. By slanting the end surface either at an obtuse angle or, as depicted in FIG. 4 at an acute angle, such reflection may be improved. It has been determined experimentally that the coefficient of reflection varies with the angle $\alpha$ and an optimum value may be found.

In the ideal case wherein a reflection coefficient of unity is obtained, there are other distinct advantages in using the reflected wave. By way of illustration, compare the properties of a first interaction device having a given number of conductive elements and responding only to a direct acoustic surface wave with a second similar device having half the number of conductive elements and responding to the direct wave and to the reflected wave obtained with a unity reflection coefficient and of aiding phase relative to the direct wave. The second device exhibits less clamped capacitance because it has fewer conductive elements and, as determined by Expression (1), it has essentially the same selectivity as the first device because the effective number of elemental transducer $N$ is the same in both cases. Expressed differently, the selectivity of the second device under the assumed conditions has increased beyond what it would have been without the influence of the reflected wave. The coupling factor in the second device increases and the energy transfer likewise increases in comparison with the first device as to which none of the energy of the direct surface wave that propagates beyond the interaction device is recovered whereas the second device does, in fact, respond to both the direct and reflected waves. Of course, the degree to which these advantages are realized is determined by the amount of reflection obtained. Furthermore, the slanted end surface, if combined with other transducer configurations, for example the circularly curved pattern of FIG. 3, reduces the loss still more. It should be noted that, rather than slanting the end itself, a passive structure similar in configuration to the active transducer and similarly coupled to the transverse end surface of the piezoelectric body may be utilized to provide the required reflection.

FIG. 5 depicts a modification of FIG. 1 having this feature. Imprinted as before upon the surface of a piezoelectric substrate 30, such as PZT, are input transducer 13 and output transducer 15. Similarly coupled to substrate 30 and spaced outwardly from transducers 13 and 15, respectively, are reflecting transducers 27 at the input end and 28 at the output end of the device.

When transducers 27 and 28 are tuned, by proper stripe spacing to have maximum interaction at the same frequency as transducers 13 and 15, they each constitute a reflector for a surface wave traveling along the surface of substrate 30. For convenience, consider interaction device 13 as the transmitter, that is to say, the one to which the input signal is applied. In response to its energization, this device tends to propagate surface waves in two opposing directions along piezoelectric body 30, one traveling directly toward the output or receiving device 15 and the other traveling in the opposite direction. The last-mentioned wave is reflected by interaction device 27 and is returned or redirected toward receiving device 15. The spacing of devices 13 and 27 is selected to have the reflected wave augment the direct wave in output device 15. This may be likened to converting the acoustic filter system from the bidirectional wave propagation characteristic of the simpler system of FIG. 1 to an essentially unidirectional system with wave propagation going predominantly from transmitting device 13 to receiving device 15.

Again, as with the transducers of the device of FIG. 1, each of the transducers of the device of FIG. 5 has clamped capacitance $C_0$. Transducers 27 and 28 have maximum reflectivity when this clamped capacitance is tuned with an inductor in parallel resonance to the frequency of the incoming wave and is not loaded with any resistor; being otherwise unconnected, these outer arrays are electrically floating. The last-described mode of operation involves a passive reflector action, but the reflecting transducers also may be used in an active mode. When transducer 27 is spaced $\pi/2$ radians which corresponds to one-quarter surface wavelength (or an integral multiple thereof) from transducer 13 and two electrical signals from o 10 are respectively applied to transducers 13 and 27 with a $\pi/2$ phase difference, the result is predominant wave propagation in a single direction for the combined pattern. Wave propagation, once again, is from the transmitting device 13 to the receiving device 15 analogous to the wave from an antenna pair of similar electrical and spatial configuration. For this active mode, then, the stripes of transducer 13 are $(p+\kappa)\lambda_s/2$ away from the corresponding stripes of transducer 27, $P$ being an integer and $\lambda_s$ being the wavelength of the surface wave. The surface wave tending to travel from device 13 in the direction of device 27 is cancelled by a like but oppositely phased wave attributable to the energization of device 27.

Although this $\pi/2$ phase difference between the respectively applied electrical signals can easily be achieved by utilizing two sources or a delay line between the source and one of the arrays, it can also be achieved by modifying the spacing of the stripes in and the spacing between transducers 13 and 27. Transducers 27 and 13, separated by $\pi/2$ wavelengths, are connected in series, and the spacing of the lines or conductive elements in transducer 27 is modified from the half wavelength relation so that the voltage across its terminals is lagging 45° ($\pi/4$) with respect to the current while the spacing of the stripes in transducer 13 is modified to produce a leading phase angle of 45°. This occurs because the impedance of a transducer is approximated by the parallel combination of the series tuned circuit $L_T$, $C_T$, $R_T$ and the inherent parallel or clamped capacitance $C_o$ as indicated in FIG. 1*a*. Adjusting the spacing, which corresponds to changing element values in the equivalent $L_T$, $C_T$, $R_T$ circuit, affects the selectivity characteristics of the apparatus while accomplishing directionality or the unidirectional propagating feature of this arrangement. This is but one more particular example of how the frequency characteristic of the transmission can be effected by different arrangements of stripe patterns. In such modifications, then, the actual physical spacing between teeth may differ from the first-described value of one-half wavelength of the acoustic wavelength of the acoustic wave at the frequency of maximum interaction.

From the description thus far, it is apparent that there is a good deal of flexibility in constructing a described acoustical filter system to impart to the wave signal receiver in which it may be incorporated a desired selectivity or frequency response. It has been explained, for example, that one may vary the number and the length of the conductive elements of which the interaction device is comprised. Usually, the conductive elements that are interleaved have a uniform spacing with respect to one another but this may change and, as will be described presently, nonuniform spacing may be used. Also, spacing of the conductive elements with respect to one another is usually one-half the wavelength of a particular acoustic surface wave but again this dimension may be modified as pointed out in the discussion of FIG. 5 for phasing purposes. So, too, resort to reflections, achieved by special termination of surfaces of the piezoelectric body as shown in FIG. 4 or by reflective interaction devices described in conjunction with FIG. 5 may be employed to attain a desired frequency response characteristic. Where two interaction devices are included at the transmitting and receiving ends of the system, their spacing with respect to one another is another parameter that may be used in influencing the response of the system. It is also expected that instead of having two separate and distinct patterns for devices 13 and 27 in FIG. 5, they may be combined into a single pattern one-half of which would have the structural features of one and the other would have the structural features of the remaining one of interaction devices 13 and 27.

In many situations, for example in communications receivers, it is desirable that such an acoustic filter be tunable, that is, be capable of having an externally variable pass band. One such arrangement is accomplished with modification of the disclosed apparatus in the manner described in the copending application of Robert Adler and Adrian DeVries, Ser. No. 592,565, filed Nov. 7, 1966, and assigned to the assignee of this application. This Adler et al. application issued on May 27, 1969 as U.S. Pat. No. 3,446,975. Specifically, such an arrangement comprises a piezoelectric substrate of a material, such as PZT or quartz, suitable for the propagation of acoustic surface waves along one of its major surfaces with at least two portions of that surface coated with a thin layer of photoconductive material together with an optical system for projecting radiant energy upon the coated portions in patterns which serve as the input and output transducers having configurations as shown and described in connection with FIGS. 1, 3, 4 and 5. The patterns may be created by transparencies in the light path with the patterns established corresponding to the selectivity characteristics desired in the particular case. A set of such transparencies may be used for tuning to a selected one of a number of discrete signal channels. In practicing this method of tuning a transmitting and a companion receiving pattern is provided for each channel to be selected and the appropriate pair of transmitter and receiver patterns is projected onto the substrate to choose a particular one of the available signal channels. Alternatively, the size of a projected image from a single transparency may be varied by optical or mechanical means to obtain continuous tuning of the transmitting device and the same control may be exercised as to the receiving device.

As another technique for imparting tunability, the electrode arrays serving as interaction devices may be removably coupled to the piezoelectric body so that a series of devices having unique maximum interaction frequencies may be readily interchanged for tuning purposes. It is known that materials with a low acoustic impedance, when pressed against a wave transmitting device, need not affect acoustic waves in the device. Although there are distinct advantages to depositing the electrodes directly on the substrate, in this case the patterns are deposited on a convenient carrier such as a low acoustic impedance material, for example plastic chosen for minimal adverse effect on the transducing process. The patterns are brought to and pressed against the piezoelectric body to achieve the requisite mechanical coupling therebetween. In this way, a tuner may be constructed in which for each channel a different set of transducers is pushed against the piezoelectric substrate, resulting in tuning to any of a plurality of discrete frequencies. The spacing between the pattern and the substrate should be less than $d/\epsilon_r$, where $\epsilon_r$ is the permittivity of the substrate and $d$ is the spacing between the stripes.

Figure 6:
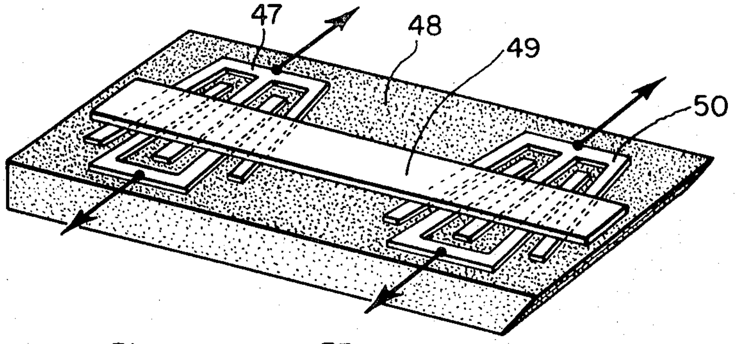
FIG. 6 is a plan view of a modification of the filter system of FIG. 1.

An apparatus utilizing and further developing this latter concept but also presenting the possibility of continuous tuning over a range is depicted in FIG. 6. Signal source 10 of FIG. 1, in series with resistor 11 and in parallel with inductor 12, is coupled across transducer 47 by means of the indicated terminals. Transducer 47 is deposited or otherwise mechanically coupled to one end of a carrier 48 of a plastic having low acoustic impedance. On the other end of carrier 48 is imprinted another transducer 50 which by means of the indicated terminals is coupled across load 18 in parallel with inductor 16. Piezoelectric bar 49, which is polarized normal to its wave propagating surface and of a length sufficient to overlap transducers 47 and 50, is juxtaposed to carrier 48 in a plane parallel to it. In this simplified isotropic case, the longitudinal edges of bar 49 are disposed parallel to the longitudinal edges of carrier 48. Furthermore, transducers 47 and 50 are thin so as not to mechanically load bar 49.

As before, the input signal from source 10 induces electric fields between the stripes of transducer 47 which fields are coupled to, and transduce an acoustic surface wave on bar 49. The resulting surface wave is translated along bar 49 to the point at which the bar is mechanically coupled to output transducer 50. The wave is imparted to transducer 50 and thus converted to an electrical output signal for application to load 18.

Also as in FIG. 1, transducers 47 and 50 are each constructed of two comblike electrode arrays. However, in this configuration the stripe spacings are tapered, one side fanning out and the mating side fanning in. Continuous tuning is achieved by moving piezoelectric bar 49 laterally relative to carrier 48 so that the spacing of the effective portions of the electrode stripes, that is to say, the segments of the stripes actively coupled to bar 49, is varied. In the nonisotropic case, bar 49 may be other than parallel to the longitudinal edge of substrate 48 to facilitate electromechanical coupling between the transducers and the acoustic wave.

Figures 7, 8, 9, 10, 10A:
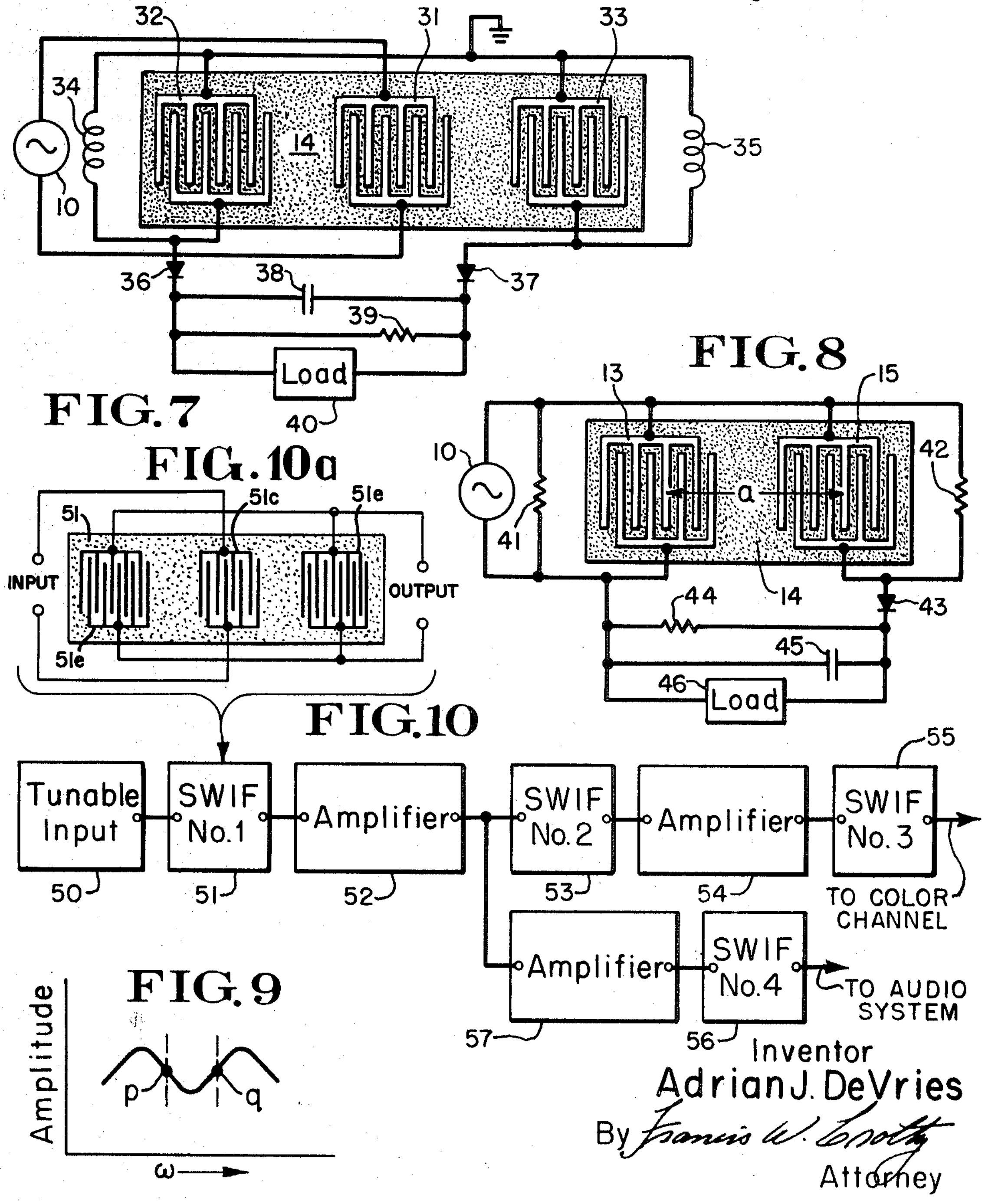
FIG. 7 is a partly schematic plan view of one embodiment of a discriminator circuit utilizing an acoustic filter system.
FIG. 8 is a partly schematic plan view of another embodiment of a discriminator circuit.
FIG. 9 is a plot of the detected signal from the apparatus of FIG. 8 as a function of frequency.
FIG. 10 is a block diagram of the IF arrangement of a color receiver in which acoustic filter systems determine the desired frequency response.
FIG. 10*a* is a schematic representation of an acoustic filter device for use in the IF arrangement of FIG. 10.

Tuned circuits or acoustic filter systems of the type proposed are of particular utility in FM discriminator circuitry as illustrated in FIG. 7. Source 10 is coupled across comb-type transducer 31 which is mechanically coupled to the center portion of piezoelectric substrate 14. Similarly coupled to the respective end portions of substrate 14 are comb-type output transducers 32 and 33. One side of each of transducers 32 and 33 is grounded. Inductors 34 and 35 are coupled across transducers 32 and 33, respectively, to tune out their clamped capacitance and also to form a DC return path. The ungrounded side of inductor 34 is connected to one end of a diode 36, while the ungrounded side of inductor 35 is connected to the corresponding end of a diode 37. Load 40, in parallel with capacitor 38 and resistor 39, is connected across the other ends of diodes 36 and 37.

In operation, source 10 produces a signal across input transducer 31 which, as described previously, transmits as surface waves those signals to which it is tuned. Transducers 32 and 33, so designed that their resonating frequencies are respectively a certain amount $\Delta f$ below and above the resonating frequency of transducer 31, act as receivers of the respectively selected acoustic signal waves and convert them to electrical signals. The output signal response as seen by load 40 has the familiar FM discriminator characteristic; the separation $2\Delta f$ between the response peaks of transducers 32 and 33 is related to the Q and the desired linearity of the discriminator in the usual manner. The circuit formed by transducer 31 and source 10 has in general a lower Q than the circuit comprising transducers 32 and 33. It may be noted that the loss normally associated with bidirectional transducer 31 is eliminated due to the fact that transducers 32 and 33 are symmetrically positioned on either side of transducer 31 in the path of surface wave propagation. In a practical receiver application source 10 delivers a frequency modulated IF signal to input device 31 and detected program information, usually audio, is delivered to load 40 where it may be further amplified prior to utilization.

Another discriminator circuit is depicted in FIG. 8. Source 10 is coupled across a resistor 41 which is in turn coupled across input transducer 13 of a device like that in FIG. 1. Hence, transducer 13 is mechanically coupled to piezoelectric substrate 14. Comb transducer 15 is similarly coupled to substrate 14, at a distance "*a*" from transducer 13, where "*a*" is their center-to-center spacing. Across transducer 15 is coupled a resistor 42. One side of transducer 13 is connected to the corresponding side of transducer 15. The other side of transducer 15 is connected to one end of a diode 43. Resistor 44, capacitor 45 and a load 46 are connected in parallel and coupled across the other end of diode 43 and the other side of transducer 13 forming a peak detector circuit with a time constant, determined by resistor 44 and capacitor 45, taking into account load 46, which is low compared to the highest FM modulating frequency.

In operation, signal source 10 induces across transmitting transducer 13 a broad-band signal comprising the sinusoidal signal of frequency $\omega$ and of the form:

$$A \cos \omega t,$$

where A is a constant. Transducer 13 is selective and emits two traveling surface waves corresponding to the electrical signal $A \cos \omega t$ one of which is received directly by transducer 15. The electrical signal produced across the terminals of transducer 15, connected in series with transducer 13, in response to this surface wave is expressed:

$$B \cos \left(\omega t - \frac{a\omega}{v_r}\right)$$

where $v_r$ is the surface wave velocity and $B$ is a constant having a value much much less than A. The output on load 46 is the detected sum of the signals:

$$A \cos \omega t + B \cos \left(\omega t - \frac{a\omega}{v_r}\right)$$

and is depicted in FIG. 9 as a function of frequency. Either point $p$ or $q$ in the curve of FIG. 9 may be selected as the operating point of a discriminator and each interactive device 13, 15 is constructed to have maximum interaction at the chosen operating point. The difference between the maxima as a function of $\omega$, which defines the sensitivity, can be varied by changing the spacing "*a*." Resistors 41 and 42 provide a DC return path, but they may be replaced by inductors, printed or conventional, which are used as part of an impedance matching network of the type previously described with relation to the apparatus of FIG. 1.

The block diagram of FIG. 10 further illustrates the manner in which acoustic filter systems of the type under consideration may be advantageously employed even to satisfy the demanding frequency response requirements of the IF channel of a color television receiver. In this arrangement the designation "SWIF" is the term that has been adopted to designate filter systems of the type shown in FIGS. 1 and 7. The expression stands for "surface wave integratable filter," and while any such filter may use two interaction devices as shown in FIG. 1, it is more efficient to utilize three interaction devices on a common substrate, preferably PZT and arranged in active coupling relation therewith in a geometric pattern like that of FIG. 7. For the embodiment under consideration, the center device is utilized as the transmitter or the one to which the input signal is applied, while the pair disposed on opposite sides thereof are connected in parallel to feed a load or the next succeeding stage. The alternate arrangement interchanging the transmitting and receiving functions may also be used. In FIG. 10, the box 50, indicated tunable input represents those portions of a color television receiver from the antenna to the start of the intermediate frequency channel. This channel has three SWIFS 51, 53 and 55 which are connected in cascade by means of stages of IF amplification 52 and 54. The output of the third SWIF feeds, through an amplifier or other convenient coupling arrangement, the color channel of the receiver including both the luminance and chrominance portions thereof which have not been shown since they may be completely conventional in structure and operation. The output of amplifier 52 is applied to a fourth SWIF 56 through an amplifier 57. The output of this SWIF is applied to the usual audio system.

The band-pass characteristics required for the utilization of this arrangement in a color receiver, while at the same time fulfilling the requirements for the reception of a monochrome signal, are set forth in Table I:

TABLE I

| Frequency (mHz.) | dB | |
|---|---|---|
| 35.25 | ≥−60 | Lower bandpass limit. |
| 39.75 | ≥−40 | Adjacent picture trap. |
| 41.25 | ≥−70 | Associated sound trap. |
| 41.67 | −7−−12 | Lower color band limit. |
| 42.17 | −6±.5 | Color carrier. |
| 42.67 | 0−−2 | Upper color band limit. |
| 44.25 | 0 | Bandpass center. |
| 45.75 | −6±.5 | Picture Carrier. |
| 47.25 | ≥−70 | Adjacent sound trap. |
| 51.75 | ≥−60 | Upper bandpass limit. |

Another requirement is that the response at the sound detector should be from 18—24 db. down from the response at the picture carrier and the amplitude response between 41.67 MHz. and 42.67 MHz. and from 45 MHz. to 45.75 MHz. should be linear. The specifications for the SWIFS are given in Table II and their structural arrangement is indicated in FIG. 10*a*, wherein the number of conductive elements or electrodes of the center transducer 51$_c$ is specifically different from that of the two end transducers 51$_e$. The difference in numbers of electrodes is another degree of freedom in shaping the frequency characteristic of the system. Actually, the number of electrodes constituting the transducers, as set forth in Table II, is larger than could conveniently be shown in FIG. 10*a*.

TABLE II

| | Center device | | | End devices | | |
|---|---|---|---|---|---|---|
| | N | fo (mHz.) | fc (mHz.) | N | fo (mHz.) | fc (mHz.) |
| SWIF No.: | | | | | | |
| 1 | 20 | 43.25 | 43.25 | 25 | 43.75 | 43.75 |
| 2 | 22 | 43.25 | 43.25 | 32 | 44.0 | 41.8 |
| 3 | 14 | 43.75 | 43.75 | 32 | 44.0 | 41.8 |
| 4 | 28 | 43.75 | 43.75 | 25 | 44.25 | 44.25 |

In Table II, *N* is the number of elemental transducers in each interaction device as explained above, *fo* is the frequency of maximum interaction of each such device and *fo* is the frequency at which the inductor resonates with the clamped capacitance of each interaction device. Moreover, it is assumed that the end devices of any SWIF are identical in structure.

Figure 11:
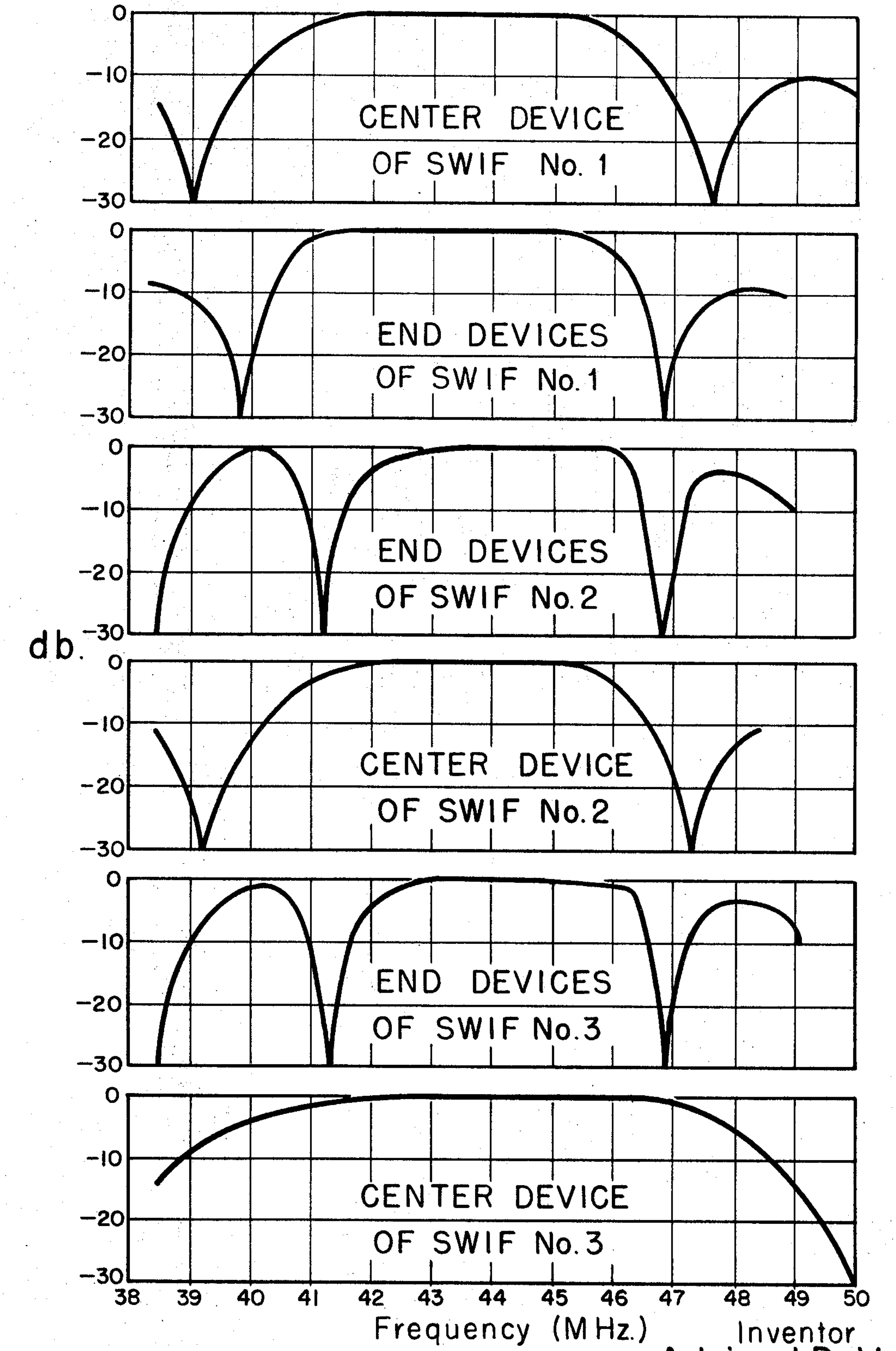
FIGS. 11—13 are response curves of the arrangement of FIG. 10.
Figure 12:
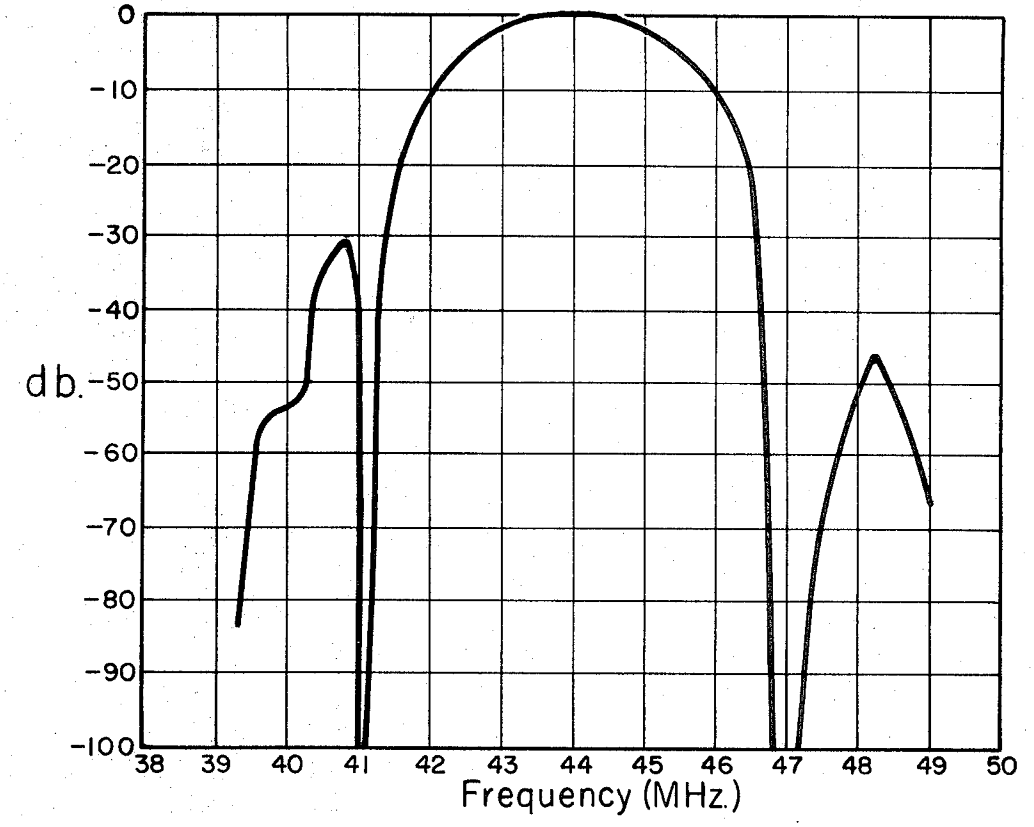
Figure 13:
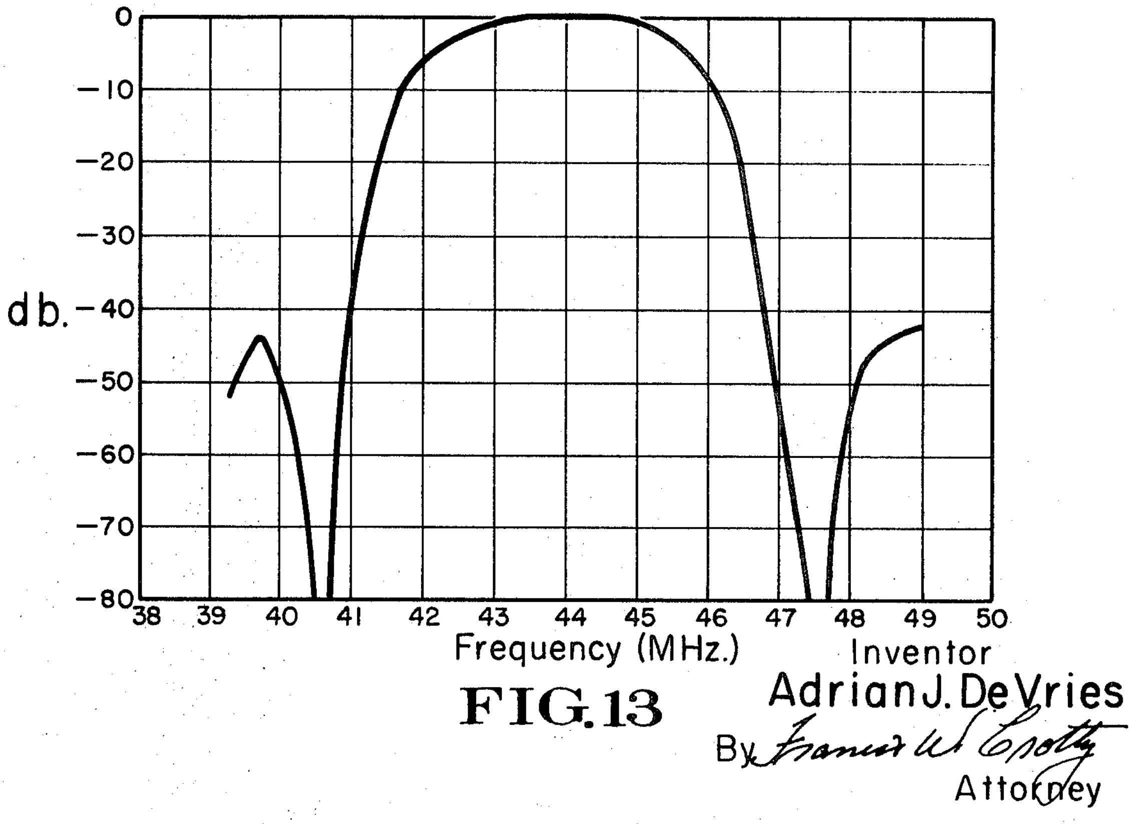

The frequency response of the interaction devices included in SWIFS Nos. 1—3 are plotted on a common frequency scale in the curves of FIG. 11 where the individual responses are identifiable by appropriate legends. The composite response of the three cascaded SWIFS is shown in the single curve of FIG. 12 and the response of the sound channel, which is determined by SWIFS 1 and 4, is shown in the curve of FIG. 13. Comparison of these composite response characteristics with the requirements of Table I shows how closely the requirements have been met. It will be observed from the specifications of Table II that the parameters referred to above, which facilitate tailoring the frequency response, have been used to achieve the necessary result. In particular, the number of elemental transducers in the interaction devices, the assigned frequencies of maximum response, and the resonant frequency of the compensating inductor in tuning out the clamped capacitance give adequate flexibility to shape the response characteristic. It will be recognized that the attainment of the desired frequency response is by an adjustment of resonant frequencies of the interaction devices relative to one another in a process that is somewhat similar to the known technique of staggered tuning of intercoupling IF transformers in wave signal receivers.

While emphasis herein has been placed upon the attainment of such features as a signal selectivity, signal selection, improved transducer performance, wave reflection and combination of these, it is to be noted that amplification may also be produced in any of the embodiments by incorporating the principles disclosed in Adler application Ser. No. 499,936, filed Oct. 21, 1965, and assigned to the same assignee. Briefly, such amplification is obtained by means of traveling wave interaction between the surface waves induced in the piezoelectric material and charge carriers drifting in a semiconductive environment.

The disclosed apparatus affords new and improved solid-state selective circuitry which has substantial advantages over predecessor devices. Materially less cumbersome attendant circuitry is required, the entire selective filter element being subject to fabrication as a single integrated circuit. Photoconductive films or physically movable structures, together with the particular properties of surface waves, enable simple tuning in variable frequency applications. While any environment requiring a selective network may advantageously utilize the principles disclosed, one particular adaptation is in that of an FM discriminator. In fact, although the comb array has been depicted only in a complete signal translating environment its selective nature makes it useful in any of a broad range of circuitry applications requiring selective elements. Further, and apart from selectivity, certain of the embodiments also yield particular utility by improving transducer performance and by enabling reflection of translated acoustic waves. In addition, the particular arrays disclosed are advantageously used at one end of the wave translating medium while at the other end the acoustic wave acts or interacts with a different mechanism, as for example when the wave is produced by or imparts purely mechanical forces, the wave interacts with light to modulate or diffract that light, or the wave interacts with electrons to modify or otherwise control or be controlled by another signal.

While particular embodiments of the present invention have been shown and described, it will be obvious to those skilled in the art that changes and modifications may be made without departing from the invention in its broader aspects. Accordingly, the aim in the appended claims is to cover all such changes and modifications as fall within the true spirit and scope of the invention.

I claim:

1. In a continuous wave broadcast signal receiver having a tunable input stage for selecting a program signal for application to a signal reproducing device, an acoustic filter system defining a band-pass signal-translating channel for translating to said reproducing device a program signal selected by said input stage, said filter system comprising:

a body of piezoelectric material propagative of acoustic surface waves;

a first interaction device, comprised of interleaved combs of a predetermined number of conductive elements actively coupled to a first surface portion of said body and having input terminals coupled to said input stage, for responding to said selected program signal to launch acoustic surface waves along said body, the number of said conductive elements being selected to establish for said first device a first predetermined response characteristic over a given frequency band;

and a second interaction device similarly comprised of interleaved combs of conductive elements actively coupled to a second surface portion of said body but differing in number from said conductive elements of said first device and having output terminals coupled to said reproducing device, for responding to said launched acoustic surface waves to deliver to said reproducing device signal energy translated by said acoustic waves, the number of said conductive elements in said second interaction device being selected to establish for said second device over said frequency band a second predetermined response characteristic which is different from said characteristic of said first device and in conjunction therewith establishes for said filter system a frequency response characteristic having a null point at a predetermined frequency in said band.

2. An acoustic filter system in accordance with claim 1 in which an edge of said body which is disposed transversely of the direction of propagation of said surface waves is slanted to define with the propagating surface an angle other than 90°.

3. An acoustic filter system in accordance with claim 1 in which said first interaction device launches a pair of acoustic surface waves which propagate in opposite directions along said body, in which said second interaction device is disposed in the propagation path of one of said pair of waves, and in which a third interaction device, structurally the same as said second interaction device including the same number of said conductive elements, is disposed in the propagation path of the other of said pair of waves.

4. An acoustic filter system comprising:

a body of piezoelectric material propagative of acoustic surface waves;

and a surface wave interaction device actively coupled to a surface portion of said body and having a maximum interaction with said body at a predetermined frequency, said device being composed of interleaved combs of conductive elements each having the configuration of a segment of a circle and with the spacing between interleaved elements being effectively one-half the length of acoustic waves at said frequency.

5. An acoustic filter system in accordance with claim 4 including a second similar interaction device disposed concentrically within said first device and actively coupled to said body.

6. An acoustic filter system in accordance with claim 5 in which the outermost one of said concentric interaction devices has a greater number of conductive elements than the other of said devices.

7. In a continuous wave broadcast signal receiver having a tunable input stage for selecting a program signal for application to a signal reproducing device, an acoustic filter system comprising:

a body of piezoelectric material propagative of acoustic surface waves;

a first electrode array, comprised of interleaved combs of conductive elements actively coupled to a first surface portion of said body and having input terminals coupled to said input stage, for responding to said program signal to launch acoustic surface waves along said body, said array being predominantly responsive at a frequency which bears a predetermined relation to the frequency of said program signal and the spacing between said elements of said combs being effectively one-half the length of acoustic surface waves at said predominant frequency;

interaction means, comprised of a second similar electrode array coupled to a second surface portion of said body and having output terminals coupled to said reproducing device, for responding to said launched acoustic surface waves to deliver to said reproducing device signal energy translated by said waves;

and a pair of inductors connected, respectively, to said electrode arrays to tune out the clamped capacitance thereof, the frequency of maximum response of one of said arrays and the frequency at which said inductor resonates with the clamped capacitance of said one array being different from, but related to, the corresponding frequencies of the other of said arrays to establish a predetermined frequency response for said system.

8.

An acoustic filter system comprising:

a body of piezoelectric material propagative of acoustic surface waves;

a surface wave interaction device actively coupled to a surface portion of said body and having a maximum interaction with said body at a predetermined frequency, said device being composed of interleaved combs of conductive elements with the spacing between said elements being effectively one-half the length of acoustic waves at said frequency and said device exhibiting a predetermined clamped capacitance;

and an inductor coupled across said combs having a value for resonating with said capacitance at said frequency.

9. An acoustic filter system in accordance with claim 8 in which an impedance, comprising a signal source or a load, is coupled across said interaction device and in which the Q of the circuit including said inductor and said impedance is small relative to the effective Q of the circuit which is the electrical analogue of the combination represented by said interaction device in coupled relation with said body.

10. An acoustic filter system comprising:

a body of piezoelectric material propagative of acoustic surface waves;

a first surface wave interaction device actively coupled to a surface portion of said body and having a maximum interaction with said body at a predetermined frequency;

and a second surface wave interaction device actively coupled to a surface portion of said body and spaced from said first device, in a direction parallel to the direction of surface wave propagation, by effectively one-quarter surface wavelengths at said frequency, both of said interaction devices being composed of interleaved combs of conductive elements with the spacing between the elements thereof effectively one-half wavelength of the acoustic surface wave for which said devices exhibit maximum interaction respectively.

11. A system as defined in claim 10 including a signal source for applying a given signal to both said interaction devices but with a phase difference of $\pi/2$ radians. $\kappa$)

12. An acoustic filter system in accordance with claim 11 in which the corresponding conductive elements of said first and second interaction devices are spaced ($P+\kappa\lambda a s$T2, where $P$ is an integer and $\lambda_s$ is the length of the acoustic waves at said frequency.

13. An acoustic filter system in accordance with claim 11 in which the spacing of the conductive elements in one of said devices is modified from the half wavelength relation to displace the potential developed across the combs thereof approximately $\pi/4$ radians in one direction relative to the current therein, while the spacing of the conductive elements in the other of said devices is modified from the half wavelength relation to displace the potential across the combs thereof approximately $\pi/4$ radians in the opposite direction relative to the current therein.

14. An acoustic filter system in accordance with claim 3 in which said interaction devices have a predetermined clamped capacitance, in which inductors are coupled to said interaction devices to tune out the clamped capacitances thereof, and in which the clamped capacitances of said second and third interaction devices are tuned out at a common frequency having a value different from that at which the clamped capacitance of said first interaction device is tuned out.

15. An acoustic filter system in accordance with claim 3 in which the middle one of said three interaction devices has a maximum interaction at one frequency while the remaining two devices have a maximum interaction at a common frequency which is different from said one frequency.

16. An acoustic filter system in accordance with claim 1 in which said body has a relative permittivity $\epsilon_r$ and in which said electrode array is removably coupled to said body and is spaced from the surface thereof by a distance not exceeding $d/\epsilon_r$, where $d$ is the spacing between conductive elements in said array.

17. An acoustic filter system in accordance with claim 16 in which the conductive elements of one comb of the electrode array are nonuniformly spaced from the interleaved conductive elements of the other comb and in which said electrode array is mechanically coupled to a low acoustic impedance member movable relative to said body to selectively dispose different portions of said electrode array in active coupling relationship with said body.

18. An acoustic filter system in accordance with claim 17 in which the conductive elements of said one comb fan apart while the conductive elements of the other comb fan together.

19. An acoustic filter system in accordance with claim 8 in which said interaction device has a maximum interaction with said body at one frequency and in which said inductor resonates with said clamped capacitance at another frequency related to said frequency of maximum interaction to establish a predetermined frequency response for said system.

20. A wave signal receiver comprising a plurality of cascade-connected acoustic filter systems, individually in accordance with claim 3, in which the interaction devices of said systems exhibit a clamped capacitance, in which an inductor is connected to each such device to resonate with the clamped reactance thereof, and in which the frequency of maximum interaction of the interaction devices of said systems and the frequencies at which the clamped capacitances thereof are resonated are selected relative to one another to provide a predetermined frequency response for said receiver.

21. A wave signal receiver comprising at least two cascade-connected acoustic filter systems, individually in accordance with claim 1, in which the number of conductive elements and the frequency of maximum interaction of the interaction devices constituting said filter systems are different from one another.

22. A wave signal receiver in accordance with claim 21 in which each of said filter systems comprises three interaction devices with the center one serving as a transmitter and with the remaining two serving collectively as a pickup and in which the two transducers of each such pickup have the same number of conductive elements and a common frequency of maximum interaction.